United States Patent
Mao

(10) Patent No.: US 8,138,562 B2
(45) Date of Patent: Mar. 20, 2012

(54) BIT LINE PREPARATION METHOD IN MRAM FABRICATION

(75) Inventor: Guomin Mao, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 350 days.

(21) Appl. No.: 12/589,193

(22) Filed: Oct. 20, 2009

(65) Prior Publication Data

US 2011/0089507 A1    Apr. 21, 2011

(51) Int. Cl.
*H01L 29/82* (2006.01)
*H01L 21/00* (2006.01)

(52) U.S. Cl. .................. 257/421; 438/3; 257/E29.323

(58) Field of Classification Search .................. 257/421, 257/E29.323; 438/3
See application file for complete search history.

(56) References Cited

U.S. PATENT DOCUMENTS

| | | | |
|---|---|---|---|
| 6,174,737 B1 * | 1/2001 | Durlam et al. | 438/3 |
| 6,969,895 B2 | 11/2005 | Han et al. | |
| 7,045,368 B2 | 5/2006 | Hong et al. | |
| 2002/0086447 A1 * | 7/2002 | Yang | 438/3 |
| 2005/0221511 A1 | 10/2005 | Wang et al. | |
| 2007/0023806 A1 | 2/2007 | Gaidis et al. | |
| 2008/0164617 A1 * | 7/2008 | Assefa et al. | 257/774 |
| 2008/0225576 A1 | 9/2008 | Zhong et al. | |
| 2008/0293165 A1 | 11/2008 | Ranjan et al. | |
| 2009/0078927 A1 | 3/2009 | Xiao et al. | |

OTHER PUBLICATIONS

International Search Report PCT/US 10/02800 Mail Date—Dec. 17, 2010, Magic Technologies, Inc.
Co-pending US Patent HMG09-047, U.S. Appl. No. 12/584,952, filed Sep. 15, 2009, "Design and Fabrication Methods of Partial Cladded Write Line to Enhance Write Margin for Magnetic Random Access Memory," assigned to the same assignee as the current invention.

* cited by examiner

*Primary Examiner* — Lex Malsawma
*Assistant Examiner* — Tanika Warrior
(74) *Attorney, Agent, or Firm* — Saile Ackerman LLC; Stephen B. Ackerman

(57) ABSTRACT

A MRAM structure is disclosed that includes a metal contact bridge (MCB) which provides an electrical connection between a MTJ top electrode and an overlying bit line. The MCB has a width greater than a MTJ top electrode and serves as an etch stop during bit line etching to prevent sub-trenches from forming adjacent to the top electrode and causing shorts. MCBs also prevent insufficient etching that causes open circuits. A MCB is preferably a metal, metal compound, or alloy such as Ta with low resistivity and high conductivity. The MCB layer is patterned prior to using a dual damascene process to form a bit line contacting each MCB and a bit line pad connection to a word line pad. MCB thickness is thin enough to allow a strong bit line magnetic field for switching a free layer and large enough to function as an efficient oxide etch stop.

27 Claims, 12 Drawing Sheets

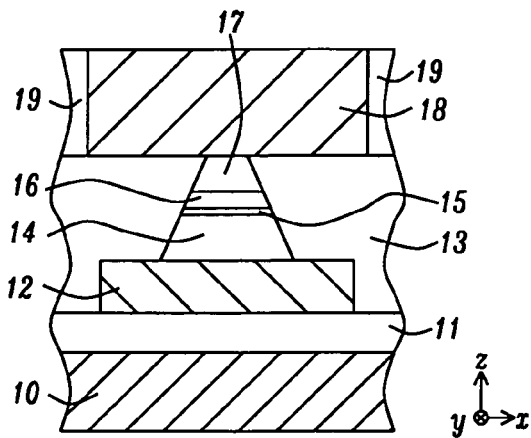
FIG. 1a – Prior Art
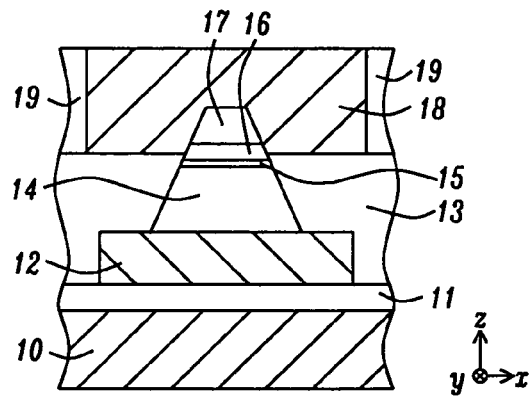
FIG. 1b – Prior Art
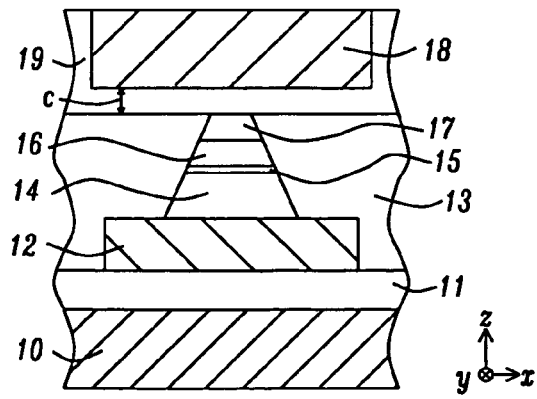
FIG. 1c – Prior Art

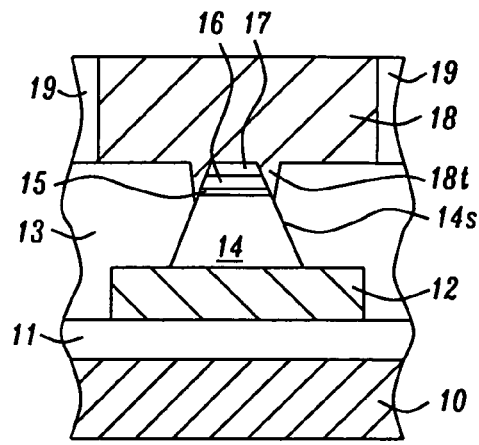
FIG. 1d – Prior Art
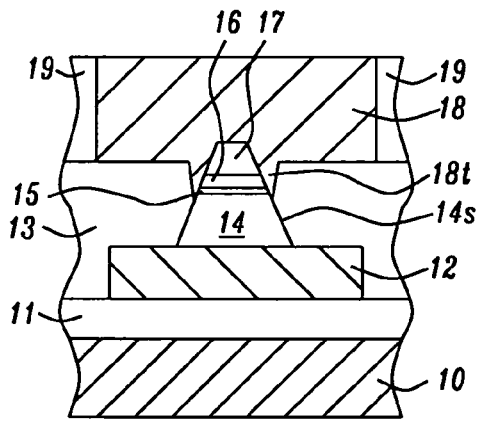
FIG. 1e – Prior Art
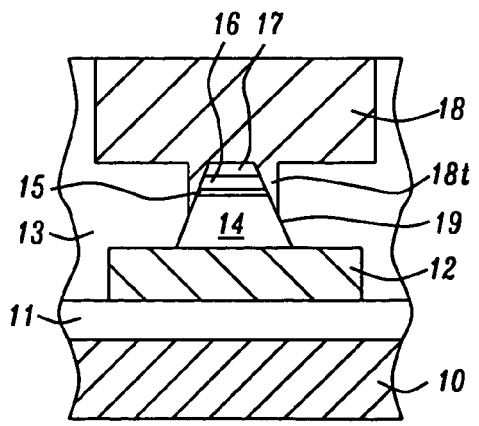
FIG. 1f – Prior Art

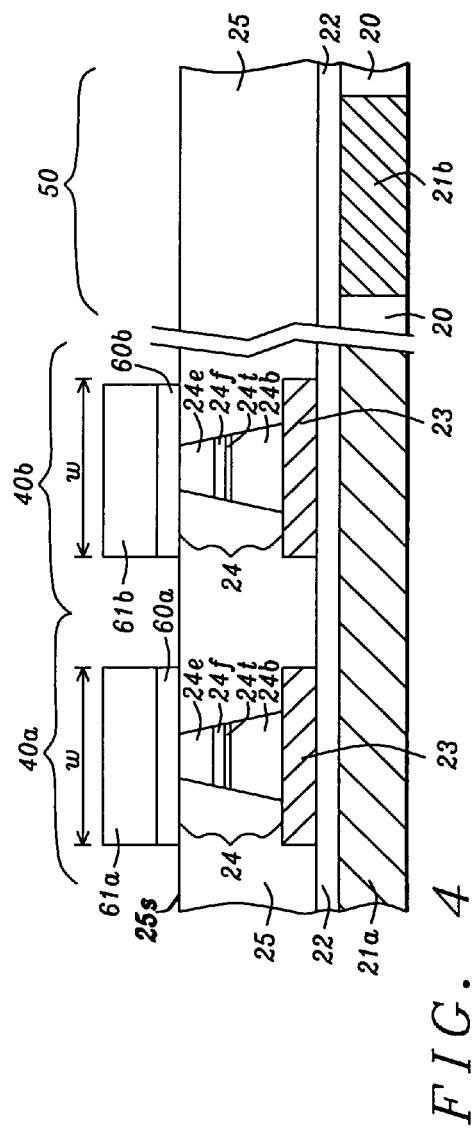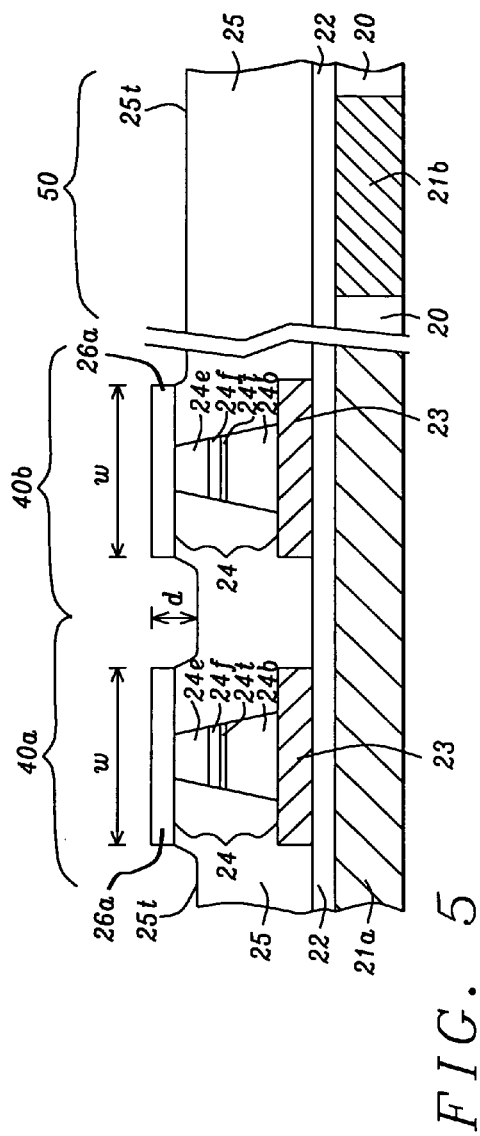
FIG. 4
FIG. 5

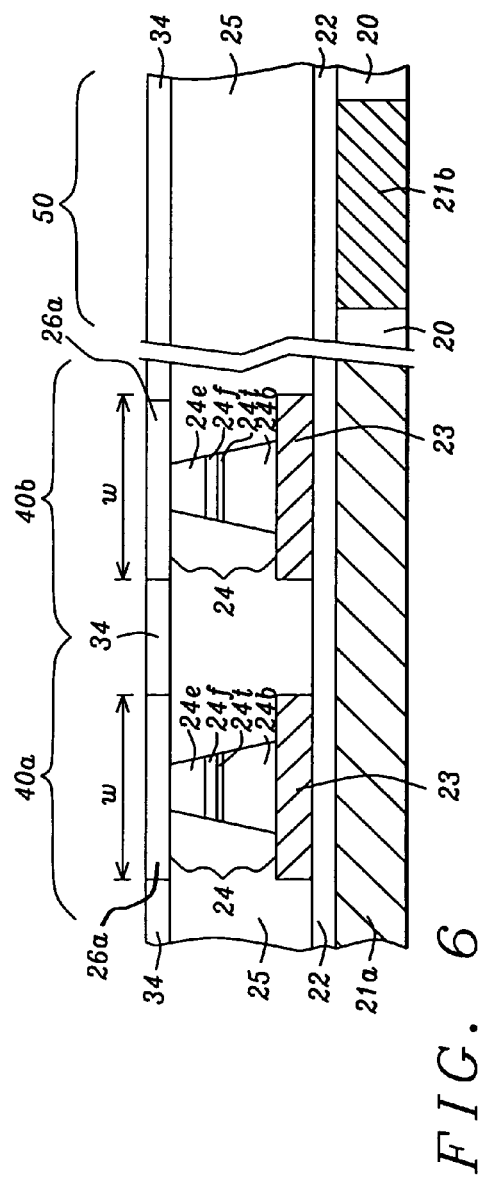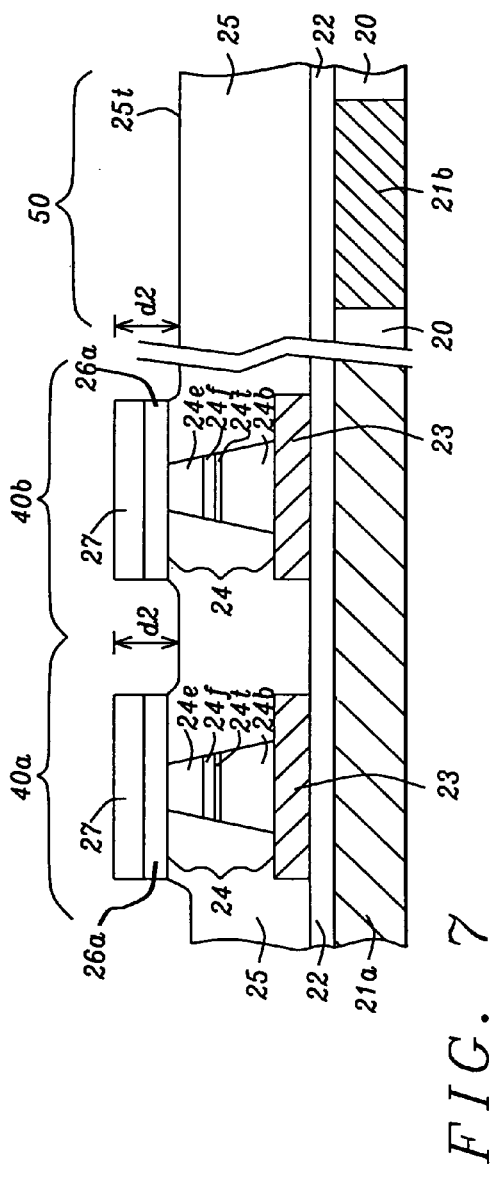

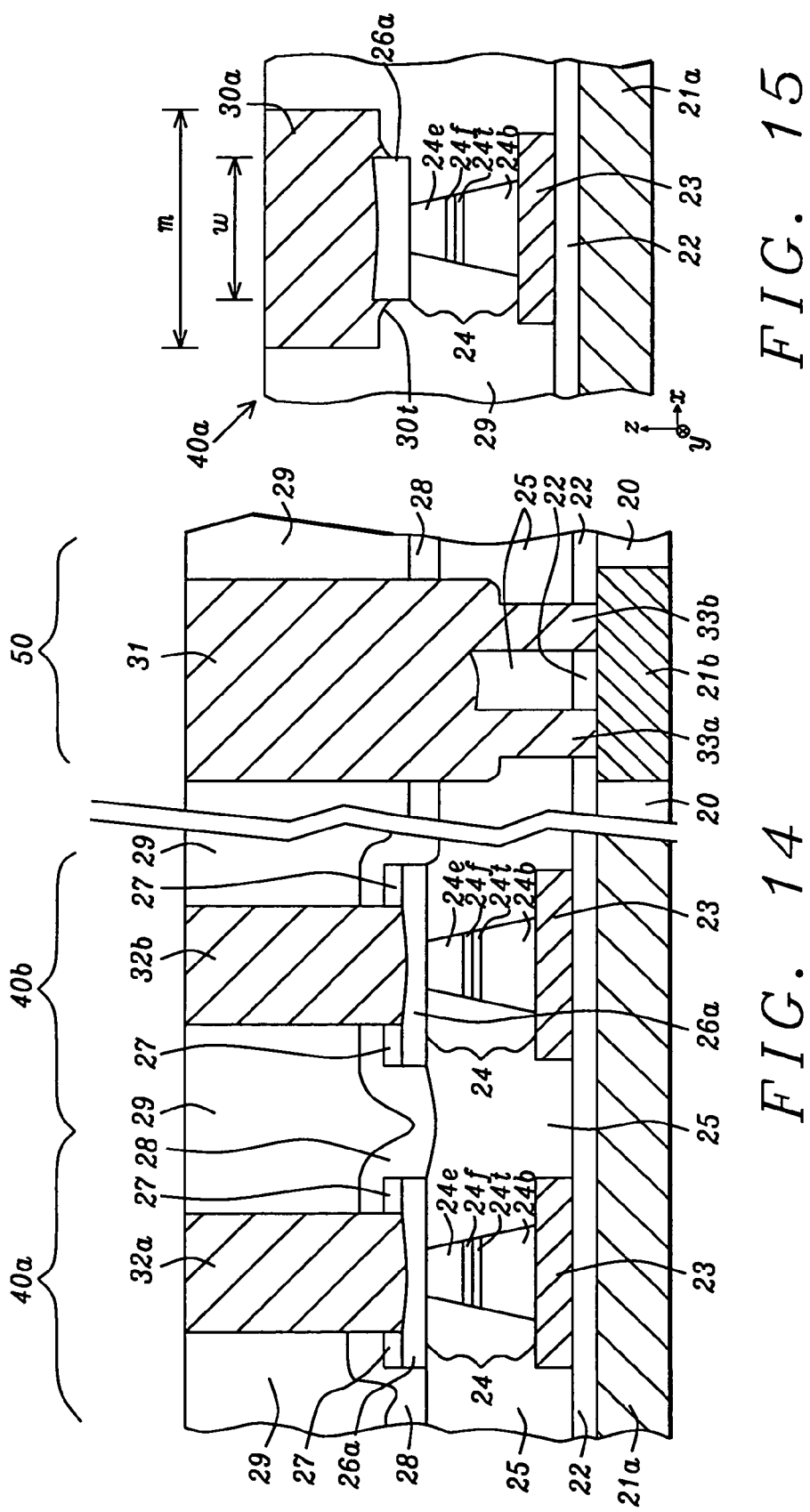

BIT LINE PREPARATION METHOD IN MRAM FABRICATION

RELATED PATENT APPLICATION

This application is related to the following: Ser. No. 12/584,952, filing date Sep. 15, 2009; assigned to the same assignee as the current invention and which is herein incorporated by reference in its entirety.

FIELD OF THE INVENTION

The invention relates to an MRAM structure, and in particular, to a metal contact bridge (MCB) layer formed between a top surface of a magnetic tunnel junction (MTJ) and a bit line (BL) to control the MTJ-BL distance and avoid over etching and sub-trench formation that can lead to electrical shorting across the MTJ tunnel barrier layer.

BACKGROUND OF THE INVENTION

Magnetic random access memory (MRAM) that incorporates a MTJ as a magnetic memory storage cell (MMC) is a strong candidate to provide a high density and non-volatile storage solution for future memory applications. An MRAM array is generally comprised of an array of parallel first conductive lines on a horizontal plane, an array of parallel second conductive lines on a second horizontal plane spaced above and formed in a direction perpendicular to the first conductive lines, and an MTJ formed at each location where a second conductive line crosses over a first conductive line. A first conductive line may be a word line while a second conductive line is a bit line or vice versa. Each MTJ has a tunnel barrier layer sandwiched between two ferromagnetic layers. One is a pinned layer whose magnetization direction is fixed and the other ferromagnetic layer is a free layer whose magnetization direction can rotate under the influence of an externally applied magnetic field that is generated by applying a current in each of the adjacent first and second conductive lines. Alternatively, the magnetization direction of the free layer is switched by applying a different level of current through the MMC as in a spin-torque or STT-RAM device.

A MRAM chip includes a plurality of MMCs which are integrated with a CMOS (complementary metal oxide semiconductor) circuit. In a MMC, data information is stored in two different magnetic states represented by a "0" where the magnetization directions of the pinned and free layers are in a parallel alignment and a "1" where the magnetization directions of the pinned and free layers are in an anti-parallel alignment. The two magnetic states have a different resistance for tunneling current across the tunnel barrier that is a thin dielectric material. During a write operation, a magnetic state for one or more MMCs is changed from a "0" to a "1" or vice versa. In a read operation, the stored information in the MMC is read by sensing the magnetic state of the junction through a sensing current flowing through the junction in a current perpendicular to plane (CPP) or in a current in-plane (CIP) fashion.

Referring to FIG. 1a, a simplified version of a MMC is depicted wherein a word line 10 is aligned in an x-axis direction and an overlying bit line 18 is aligned in a y-axis direction. There is a dielectric layer 11 separating the word line 10 from a bottom electrode 12 to isolate the two electrical components from each other. A magnetic tunnel junction is enclosed in a dielectric layer 13 and comprises a lower magnet 14 including a pinned layer and typically an anti-ferromagnetic (AFM) layer (not shown), a tunnel barrier layer 15, an upper magnet or free layer 16, and a top electrode 17. The lower magnet is electrically connected through the bottom electrode and a via (not shown) to a CMOS transistor while the upper magnet 16 contacts the top electrode 17 and is electrically connected to the bit line (BL) 18.

One of the challenges associated with MRAM fabrication is to control the distance between the free layer in a MTJ and an overlying conductive line such as BL 18 since the distance plays an important factor in determining the efficiency of switching the magnetization direction in the free layer during a write process. A conventional MRAM fabrication involves defining the MTJ layers by patterning a mask layer on the top surface of top electrode 17 and then using an etch process to transfer the pattern through the MTJ stack of layers. Once the MTJ cell is defined, the mask is stripped and the dielectric layer 13 is deposited to a thickness that covers all of the MTJ layers. Then a chemical mechanical polish (CMP) method is employed to planarize the top surface so that dielectric layer 13 is coplanar with top electrode 17. In a well controlled CMP process, there are no protrusions of top electrode 17 above the top surface of dielectric layer 13, and the dielectric layer which is usually an oxide has a smooth surface with no dishing or bumps at the MTJ interface. Thereafter, a BL 18 is formed within a second dielectric layer 19 and contacts the top electrode 17. A second CMP process is generally used to make BL 18 coplanar with second dielectric layer 19. Although this method is straightforward and can be successfully implemented for a MMC with a thick top electrode having a thickness greater than 200 Angstroms, there are several practical issues encountered for fabricating a MMC with a thin top electrode 17 (<200 Angstroms thick) for advanced MRAM devices as illustrated in FIGS. 1b-1f.

To maximize the magnetic influence of a bit line on a free layer in a MTJ, one option is to make the bit line as close as possible to the MTJ tunnel barrier and free layer. One way to accomplish this effect is to employ a relatively thick TE but position the bottom of the bit line substantially below the top surface of the top electrode as shown in FIG. 1b. This design can easily lead to degradation in MTJ performance since the top electrode 17 is usually made of Ta and has a higher resistance than Cu in BL 18. The intrusion of top electrode 17 into BL 18 will decrease the electrical conductivity through the bit line. Furthermore, since the shape of BL 18 is no longer linear due to the intrusion by top electrode 17, the local magnetic field generated by BL 18 is reduced thus making the writing operation to free layer 16 more difficult. It is also difficult to control the amount of intrusion of top electrode into BL 18 and in some cases, the bit line may contact the free layer 16 to further deteriorate magnetic performance.

Another way to maximize the magnetic influence of BL 18 on free layer 16 is to use a very thin top electrode 17 as in FIG. 1c. Because of film thickness non-uniformity, etch rate non-uniformity and morphologic variations across the surface of BL interlevel dielectric layer (ILD) 19, a certain amount of overetch should be applied to form an opening in which BL 18 is deposited. However, it is difficult to adjust the amount of overetch because one does not want to etch substantially beyond the top surface of top electrode 17 and risk forming a situation as described with regard to FIG. 1b. On the other hand, the etch must proceed to an extent that the top surface of all top electrodes 17 are uncovered so that BL 18 can make contact with each MTJ in the MRAM array. A slight etching process drift can easily cause an open circuit between top electrode 17 and BE 18 for some MMC cells if the initial over etching margin is not set correctly. As a result of under etching, a gap with thickness d of BL ILD 19 is formed between top electrode 17 and BL 18 to cause an open circuit.

Another concern related to plasma etching of BL ILD 19 is the tendency to create a ditch or sub-trench along the boundary of BL ILD and top electrode 17 as illustrated in FIG. 1*d*. The sub-trench may extend deep into dielectric layer 13 and actually contact the sidewalls 14*s* of the lower magnet 14. After BL 18 is deposited, the sub-trench is filled with a bit line portion 18*t* and can short the MTJ barrier 15 by forming an electrical circuit around the tunnel barrier such that the BL 18 directly contacts lower magnet 14. This undesirable condition may occur for a thin top electrode even for a setting where there is a right amount of overetch to ensure that all BL ILD 19 is removed from the top surface of top electrode 17.

Referring to FIG. 1*e*, the sub-trench 18*t* problem may become worse if the MTJ cell has a small size and/or more tapered sidewalls 14*s*. Then, even for a thick top electrode 17, the plasma etch process to form an opening (not shown) in BL ILD 19 has a strong tendency to create a deep sub-trench that contacts sidewalls 14*s*.

In a worst case scenario shown in FIG. 1*f*, all factors mentioned previously including a thin top electrode 17, small size MTJ, more tapered sidewalls 14*s*, and long over etch combine to produce a large filled sub-trench 18*t* that shorts the MTJ.

Considering all of the potential fabrication issues referred to in FIGS. 1*b*-1*f*, there is a need to improve the MRAM fabrication sequence and thereby improve production yields and enhance magnetic performance.

In U.S. Pat. No. 6,174,737, a method of forming a MRAM structure is disclosed where a top electrode in the form of a conductive line runs over a plurality of magnetic memory cells. A dielectric layer is deposited on the conductive line and then a trench which is aligned orthogonal to the conductive line is formed within the dielectric layer. The trench is filled with a lower conductive layer and an upper bit line. Overetching into the dielectric layer surrounding the magnetic memory cells is prevented by forming an etch stop layer that is coplanar with the conductive line. However, this method teaches the formation of a top electrode separately from the magnetic memory cell which is generally not practiced in current designs where higher efficiency is achieved by forming the top electrode simultaneously with the magnetic memory cell.

U.S. Pat. No. 7,045,368 describes a MRAM fabrication method where the MTJ ILD layer is planarized in two steps. A CMP process removes an upper portion of the dielectric film above the capping layer and a RIE process further thins the MTJ ILD layer to 50 to 190 Angstroms below the top surface of the MTJ. This method does not prevent shorting or sub-trenches from forming especially when the capping layer (top electrode) is less than 200 Angstroms thick.

In U.S. Patent Application Publication 2009/0078927, a composite hard mask is employed to define a MTJ shape. However, the invention does not provide a means to control subsequent etching processes from forming a sub-trench along the MTJ.

U.S. Pat. No. 6,969,895 describes a controlled method of forming a bit line by using a sacrificial layer on the capping layer in the MTJ. The sacrificial layer is removed after the MTJ is defined and affords a consistent capping layer thickness but does not have any controlled influence on a later BL ILD etch step than can cause sub-trenches.

In U.S. Patent Application Publication 2007/0023806, a relatively thick hard mask is formed between a MTJ and a bit line. Although the additional thickness of the hard mask prevents bit line ILD etching from reaching the MTJ, it does add extra distance between MTJ and bit line and can therefore degrade free layer switching capability.

SUMMARY OF THE INVENTION

One objective of the present invention is to provide a MRAM structure that enables better control of the distance between a free layer in a MTJ and an overlying bit line or word line so that higher MRAM production yields are achieved and MRAM performance is enhanced.

A further objective of the present invention is to provide a method of forming the MRAM structure according to the first objective that is economical and reproducible on a manufacturing scale.

These objectives are achieved in a MRAM structure comprised of a MTJ that has a bottom surface contacting a bottom electrode and a top surface connected to an overlying word line or bit line. In one aspect, the MTJ has a bottom spin valve configuration in which a lower portion including a pinned layer, a tunnel barrier layer, and an upper portion comprising a free layer, and an uppermost top electrode are sequentially formed on a bottom electrode. A top surface of the top electrode is coplanar with a MTJ ILD layer. A key feature is a metal contact bridge (MCB) which has one side contacting the top surface of the top electrode and an opposite side adjoining a word line or bit line. The MCB serves as an etch stop when a trench is etched in an overlying dielectric layer during formation of a conductive line thereby preventing over etching of the MTJ ILD layer and formation of sub-trenches adjacent to the top electrode. Preferably, the MCB has a thickness from about 50 to 100 Angstroms and is made of a low resistivity metal or metal nitride that can also function as a Cu diffusion barrier such as Ti, TiN, Ta, TaN, or W. Thus, the electrical resistance of the connection between an overlying bit line and the top electrode is not increased and the MCB can serve as an etch stop barrier with high selectivity to bit line ILD layer. In one embodiment, the MCB has a width greater than that of an overlying bit line. According to an alternative embodiment, the MCB layer has a width less than or equal to that of an overlying bit line but the width of the MCB layer must be substantially greater than a top critical dimension (CD) of the top electrode to prevent sub-trench formation.

There are several embodiments for forming a MRAM structure according to the present invention and all involve the deposition of a MCB layer on a substrate comprised of a plurality of MTJs formed within a MTJ ILD layer such that a top surface of a top electrode in each MTJ is coplanar with the MTJ ILD layer. A photoresist layer is coated and patterned on the MCB layer and then a metal etch process is employed to transfer the pattern through the MCB layer to form a plurality of metal contact bridges (MCBs) such that there is a MCB contacting a top electrode in each MTJ. The MCB layer is entirely removed above word line (WL) pad areas to allow formation of vias between subsequently deposited BL pads and WL pads. After the photoresist mask is stripped, a wet cleaning step is applied to remove metal residues. Thereafter, a dual damascene process is followed to deposit a silicon nitride layer on the MCBs and to fill the openings between adjacent MCBs. Then a thick oxide layer is deposited on the silicon nitride layer. Vias are formed in the thick oxide layer and extend into a dielectric layer above the WL pads. Next, a trench is formed above each MCB and in the thick oxide layer and silicon nitride layer above the vias to WL pads. Finally, BL metal is electroplated in the trenches and vias to form a BL that contacts each MCB as well as a BL pad that is electrically connected through vias to a WL pad.

In a second embodiment, a dielectric (MCB ILD) layer is deposited on the MTJ ILD layer and then planarized to be coplanar with the top surface of the MCBs. Then the dual damascene process outlined in the first embodiment is followed. The advantage of this embodiment is that the dual damascene process is performed on a flat substrate which allows a larger process window for some process steps.

According to a third embodiment, a silicon nitride layer is deposited on the MCB layer prior to patterning and forming a plurality of MCBs. This method offers protection to the surface of the MCB layer during plasma etching, photoresist stripping, and wet cleaning steps. If the silicon nitride layer is sufficiently thick, then there is no need to deposit an extra silicon nitride layer for the dual damascene process.

A fourth embodiment is a modification of the third embodiment where a relatively thin silicon nitride layer is used to protect the MCB layer during the metal etch. In this case, a second silicon nitride layer is formed on the first silicon nitride layer and to fill the gaps between adjacent MCBs as part of the dual damascene process to form a bit line metal pattern. As a result, the large MCB topography of the third embodiment is considerably reduced to improve the process window during the dual damascene process.

BRIEF DESCRIPTION OF THE DRAWINGS

FIG. 1a is a cross-sectional view of a conventional MRAM cell, and FIGS. 1b-1f are cross-sectional views showing possible outcomes for placement of a bit line on a MTJ as a result of overetching or underetching a dielectric layer adjacent to the MTJ.

FIG. 4 is a cross-sectional view of the MRAM structure in FIG. 3 after formation of a photoresist patterning mask on a MCB that contacts a top electrode in each MTJ.

FIG. 5 is a cross-sectional view of the MRAM structure in FIG. 4 following plasma metal etch and a post etch wet cleaning step that partially etches an underlying MTJ ILD layer according to a first embodiment of the present invention.

FIG. 6 is a cross-sectional view of the MRAM structure in FIG. 5 after an oxide layer is formed coplanar with the MCB pattern according to a second embodiment of the present invention.

FIG. 7 is a cross-sectional view of a MRAM structure after a nitride protective layer is formed on the MCB layer and then the MCB layer is patterned according to a third embodiment of the present invention.

FIG. 14 is a cross-sectional view of a fourth embodiment of the present invention after a dual damascene sequence is performed on the intermediate MRAM structure in FIG. 8 to form a bit line over each MCB and a bit line pad over a word line pad.

FIG. 15 is a cross-sectional view of an embodiment of the present invention wherein a metal contact bridge has a width equal to or greater than that of an underlying top electrode but less than that of an overlying bit line.

DETAILED DESCRIPTION OF THE INVENTION

Figure 2:
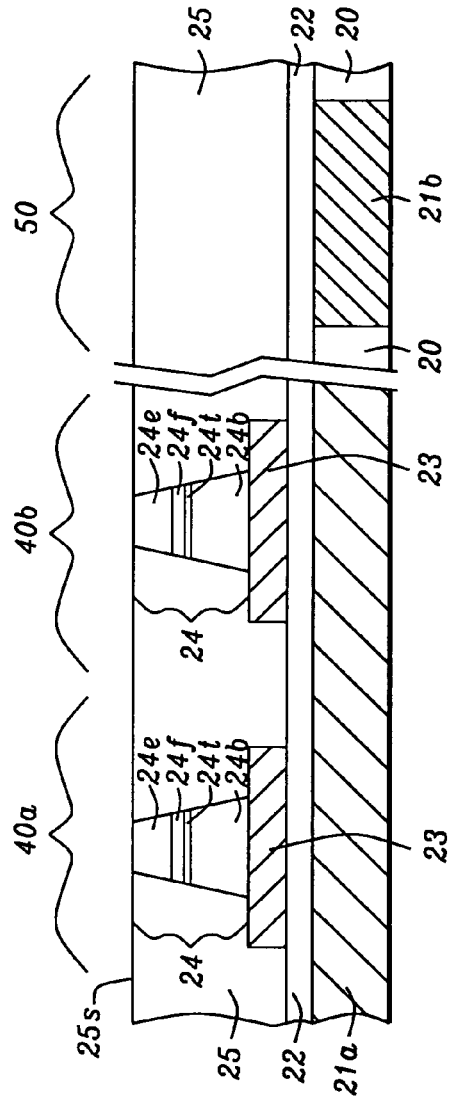
FIG. 2 is a cross-sectional view showing an intermediate step in the formation of a MRAM structure according to an embodiment of the present invention.

The present invention is a MRAM structure that includes a metal contact bridge (MCB) formed between a top surface of each active MTJ in a MRAM array and a side of a bit line or word line that faces a plurality of MTJ elements. Although the exemplary embodiment depicts a bit line formed above a MTJ having a bottom spin valve structure, and a word line below the MTJ, the designation for bit line and word line may be reversed. Moreover, the terms bit line and word line may be interchanged with other terms such as column line, row line, data line, and digit line. Alternatively, the MTJ may have a dual spin valve configuration as appreciated by those skilled in the art. Although only two MRAM cells and one word line pad are shown in the drawings, it should be understood that there are a plurality of MRAM cells and word line pads on a MRAM chip that has multiple rows intersecting with multiple columns of MRAM cells. The present invention is also a method of forming a MRAM structure that comprises a plurality of MCBs wherein a MCB is formed between each active MTJ and an overlying bit line or word line. Magnetic memory cell (MMC) may be used interchangeably with the term MRAM cell.

Referring to FIG. 2, a portion of a MRAM structure in a MRAM chip is shown that includes two MRAM cells 40a, 40b and a word line (WL) pad area 50. There is a word line metal layer formed coplanar with a dielectric layer 20 on a substrate (not shown). Word line metal layer is comprised of word line 21a formed in a MRAM cell array and a word line pad 21b formed in a WL pad area 50. A dielectric layer 22 is formed on dielectric layer 20, WL 21a, and on WL pad 21b in order to insulate the word line metal layer from a bottom electrode 23 formed in each MRAM cell 40a, 40b. Each of the bottom electrodes 23 is formed on dielectric layer 22 and is electrically connected by a via (not shown) to a transistor (not shown) in the substrate. A bottom electrode 23 may have a rectangular shape (from a top-down view) that is defined by a patterning process prior to the formation of MTJ elements 24, or following the patterning of the MTJ elements by a conventional method. In one aspect, the array of bottom electrodes 23 may be formed within a BE ILD layer (not shown) when the bottom electrodes are patterned prior to patterning the MTJ elements. Optionally, the MTJ ILD layer 25 may adjoin the sides and top surface of each bottom electrode 23 and the sides of MTJ elements 24 in an embodiment where the bottom electrodes are patterned after the MTJ elements are defined.

There is a MTJ 24 aligned above each bottom electrode 23 in each MRAM cell 40a, 40b. A MTJ 24 has an uppermost top electrode 24e that may be comprised of a composite such as Ru/Ta/Ru or Ru/Ta. In an embodiment wherein the top electrode 24e is a composite with an upper Ta layer, the Ta layer serves as a hard mask or stop layer for subsequent CMP and reactive ion etch processes. In another embodiment, the top electrode 24e may be a composite with a so-called capping layer that contacts a free layer 24f and an uppermost hard mask such as Ta. In the exemplary embodiment where the MTJ has a bottom spin valve configuration, a free layer 24f is formed between a tunnel barrier layer 24t and a top electrode 24e. A free layer as described herein may be a composite comprised of a stack of two or more magnetic layers. In another aspect, a free layer 24f may include an oxygen surfactant layer (OSL) or other non-magnetic layers used in the art to improve the magnetoresistive ratio (MR) of the MTJ. The bottom layer 24b in each MTJ typically includes a pinned ferromagnetic layer and an anti-ferromagnetic (AFM) layer to pin or fix the magnetic moment of the pinned layer in a certain direction. Note that the MTJ ILD layer 25 has a top surface 25s that is essentially coplanar with the top electrode 24e.

Figure 3:
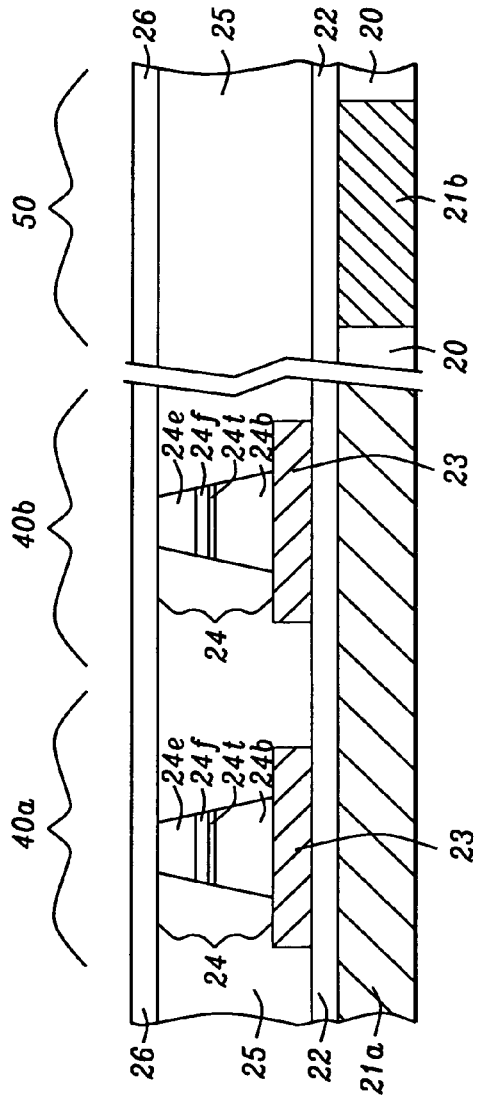
FIG. 3 is a cross-sectional view of the MRAM structure in FIG. 2 after a metal contact bridge layer is deposited on a plurality of MTJ elements.

Referring to FIG. 3, a MCB layer 26 is deposited on the top surface 25s and on top electrode 24e in MRAM cells 40a, 40b. MCB layer 26 is comprised of one or more of Ta, TaN, Ti, TiN, W, or other low resistivity materials including metals, metal compounds, and alloys that will not increase resistance in the electrical path between top electrode 24e and a subsequently deposited bit line. Alternatively, the MCB layer may be a laminate of one or more metals, metal compounds, and alloys. Furthermore, the MCB layer 26 serves as a stop layer for low bias etching of dielectric materials and as a barrier layer to block bit line metal such as Cu from diffusing into an underlying dielectric layer. Although MCB layer 26 may have a thickness in the range of 30 to 300 Angstroms, a preferred thickness is from 50 to 100 Angstroms. The MCB layer should not be so thin that patterned metal contact bridges 26a (FIG. 4) are ineffective in preventing bit line etching from forming sub-trenches adjacent to top electrode 24e during a subsequent dual damascene process. On the other hand, the resulting MCBs 26a should not be too thick or the magnetic field generated by an overlying bit line (not shown) during a write process will have diminished effect in switching free layer 24f. When selecting the appropriate MCB layer 26 thickness, one must take into account the amount of MCB thickness loss during etching of bit line trenches as explained in a later section. For example, if there is a 50 Angstrom MCB thickness loss during a subsequent etch process and a minimum thickness range of 20 to 50 Angstroms is required for MCBs 26a, the initial deposition thickness for MCB layer 26 should be at least 70 to 100 Angstroms.

A composite MCB layer 26 may be employed in examples where there is poor adhesion of a metal MCB material to the MTJ ILD layer 25. For example, a thin layer of TaN may be deposited on the MTJ ILD layer 25 and on top electrode 24e before depositing a Ta layer to give a TaN/Ta MCB layer 26 configuration.

With regard to FIG. 4, a first step in the patterning of MCB layer 26 to form a MCB 26a aligned above a top electrode 24e and MTJ 24 in each MRAM cell 40a, 40b is to sequentially coat a bottom anti-reflective coating (BARC) and a photoresist layer on the MCB layer 26. Subsequently, the photoresist layer is patterned by a well known photolithography process to give a photoresist mask 61a in MRAM 40a and a photoresist mask 61b in MRAM 40b. From a top-down view (not shown), the photoresist masks 61a, 61b may be in the form of a line or sectioned line at locations where a MCB will be fabricated in the underlying MCB layer 26. In other words, the patterned MCB layer may take the form of parallel lines or sectioned parallel lines. In the latter case, there will be a separate MCB above each MTJ in a MRAM array. The openings in the photoresist layer are transferred through the BARC by a first etch step to generate a patterned BARC layer 60a below photoresist mask 61a and a patterned BARC layer 60b below photoresist mask 61b.

Referring to FIG. 5, a second etch step which is a plasma metal etch is used to transfer the openings through the MCB layer and thereby form a plurality of MCBs 26a. After etching, the photoresist mask layers 61a, 61b and BARC layers 60a, 60b are removed by a dry plasma strip process or with a wet stripper. The resulting width w of each MCB 26a is preferably substantially greater than the width of a top electrode 24e, and greater than the width of a subsequently deposited bit line (not shown). MCB layer 26 is entirely removed in word line pad area 50 to enable a via connection from a bit line pad in a later process step.

At this point, the remaining fabrication sequence to form a bit line metal pattern above the MCBs 26a and above word line pad area 50 can diverge into different pathways. According to the present invention, four of the preferred pathways are described with regard to FIGS. 5-13. However, the present invention also encompasses other fabrication schemes that involve a dual damascene process to form a bit line pattern on plurality of MCBs 26a in a MRAM array. The dual damascene method offers an advantage in forming a bit line metal layer where bit line pads are connected to word line pads at the same time as bit line connections to MTJ elements. It should be understood that the MTJ layout may include a plurality of so-called dummy MTJ elements that are not used for storing information but only for assisting in a subsequent CMP step to provide improved polish uniformity over the entire substrate. In this case, a MCB 26a is not necessarily formed above a dummy MTJ. In another aspect, a MCB 26a may be formed over a dummy MTJ to improve the MRAM design.

According to a first embodiment in FIG. 5, a wet cleaning process is performed to remove residues produced during the aforementioned metal plasma etch process. Since it is important to remove all metal residues to ensure that neighboring MCBs 26a are electrically isolated, the wet clean process may be applied for an extended period of time. Typically, due to the over etch and wet cleaning conditions, there is some erosion or etching of the top surface 25s of MTJ ILD layer 25 to form a new top surface 25t that is a distance d below the top surface of MCBs 26a. For a thin MCB 26a that is less than 100 Angstroms thick and with a certain amount of over etch and wet clean processing that causes less than 50 Angstroms loss of oxide (MTJ ILD 25), d which is also referred to as MCB depth or step height is typically less than 150 Angstroms and the resulting topography should not be severe enough to cause patterning issues for later process steps. With a MCB layer that is greater than 200 Angstroms thick and over etch and wet clean process conditions that erode more than 100 Angstroms of MTJ ILD layer 25, step height d may lead to processing issues in later steps depending on two factors. First, if a subsequent CVD deposition forms a BL ILD layer 29 (FIG. 9) that is greater than 2000 Angstroms thick, the morphological variation of the BL ILD surface might flatten out and will not lead to problems with subsequent photoresist patterning and etching steps. Secondly, if the width w is substantially greater than the width of the intended bit line, there should not be processing issues with later steps.

Figure 9:
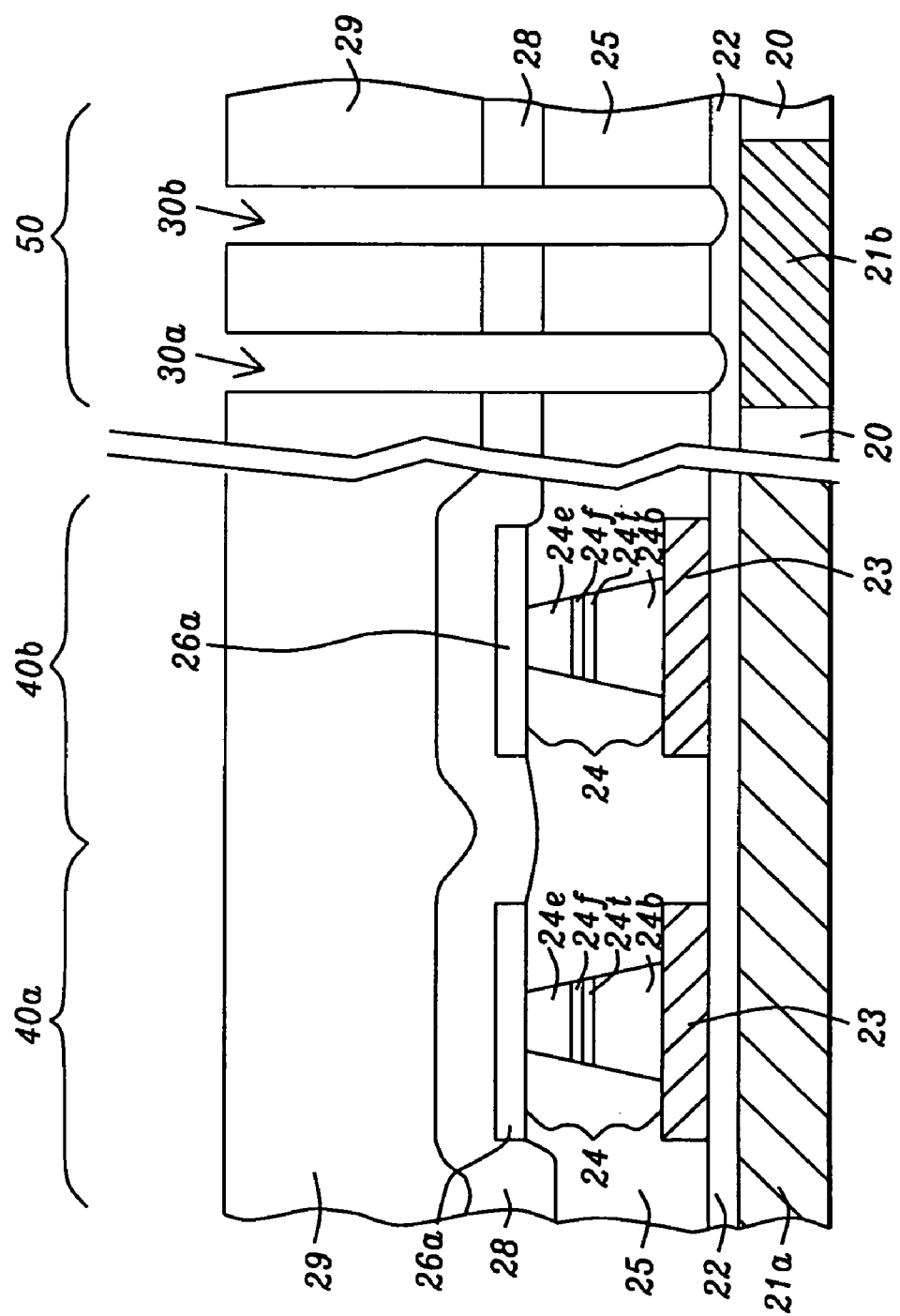
FIG. 9 is a cross-sectional view after a nitride layer and thick oxide layer are sequentially deposited on the MRAM structure in FIG. 5 and then via openings are formed above a word line pad according to a method of the first embodiment.

Referring to FIG. 9, the first embodiment for forming a MRAM cell that includes a MCB 26a between each MTJ 24 and an overlying bit line continues with deposition of a dielectric layer 28 that is preferably silicon nitride having a thickness of 200 to 500 Angstroms on MCBs 26a and on top surface 25t of MTJ ILD layer 25 by a chemical vapor deposition (CVD), plasma enhanced CVD (PECVD), or the like. Optionally, silicon oxynitride or silicon carbide may be used as dielectric layer 28. Then a relatively thick oxide layer hereafter referred to as BL ILD layer 29 is deposited on dielectric layer 28.

A well known dual damascene process is employed to initially form vias 30a, 30b in BL ILD layer 29 that extend through dielectric layer 28, MTJ ILD layer 25, and stop on dielectric layer 22 above word line pad 21b. The vias 30a, 30b will be extended through dielectric layer 22 during a subsequent etch step where a bit line trench is overetched. The via formation process involves patterning a photoresist layer (not shown) and etch transferring the via openings in the photoresist layer through the underlying layers. The photoresist layer is stripped before proceeding with additional steps. It should be understood by those skilled in the art that a trench first dual damascene process may be followed but the via first method described herein is generally preferred for trenches (not shown) that have a small critical dimension (CD) of less than about 0.5 microns.

Figure 10:
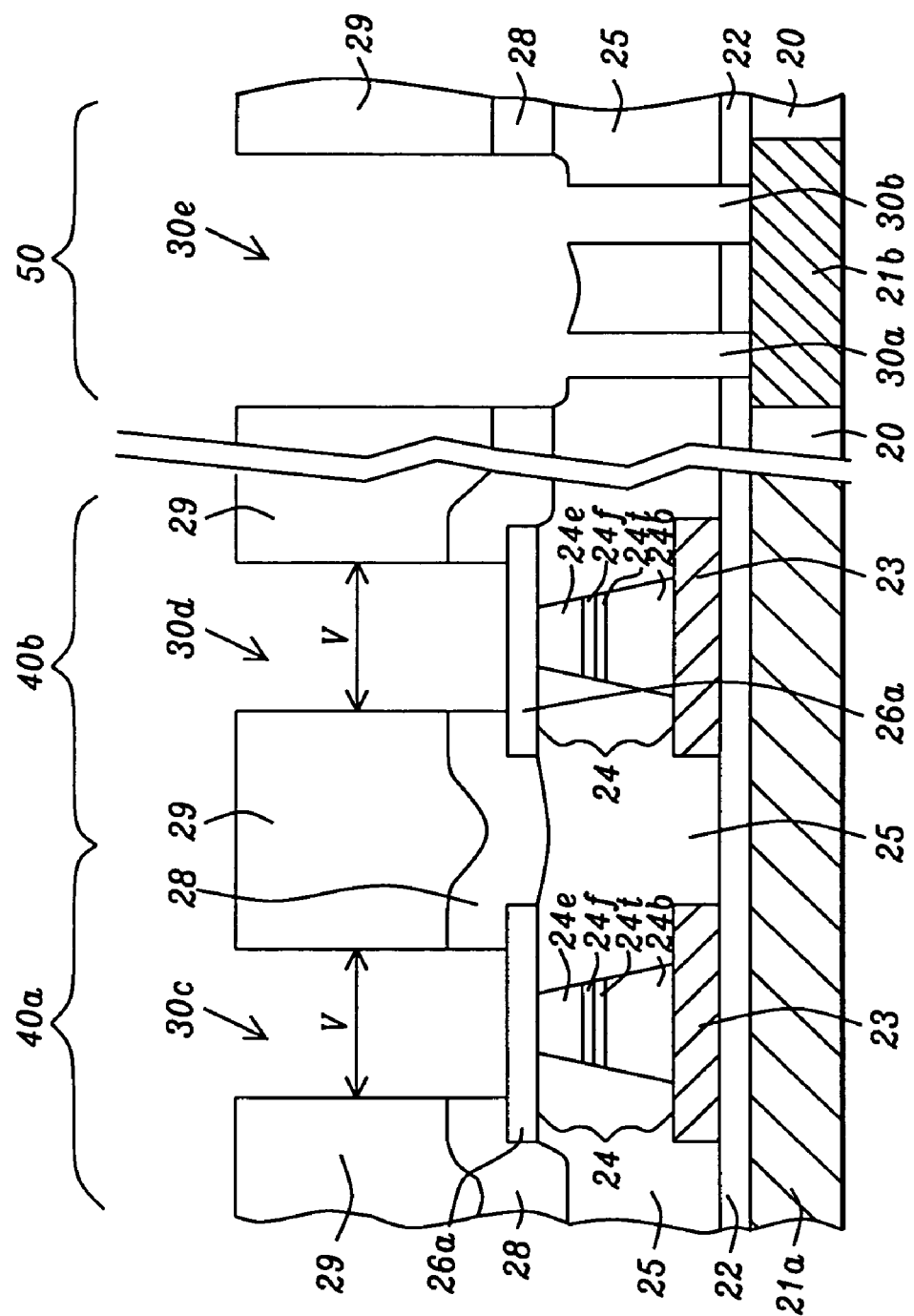
FIG. 10 is a cross-sectional view of the MRAM structure in FIG. 9 after trench openings are formed above metal contact bridges in MRAM cells.

Referring to FIG. 10, after the vias 30a, 30b are etched and stop on dielectric layer 22, a wet cleaning process is performed to remove etch residues and then a second BARC and second photoresist layer (not shown) are sequentially coated on the BL ILD layer 29. Note that the BARC will fill vias 30a, 30b and prevent dielectric layer 22 from being removed during the oxide etching of bit line trenches as described below. Thus, metal in WL pad 21b is not exposed to plasma that could damage a Cu surface, for example.

A photolithography process is performed to form a pattern in the photoresist layer including a trench opening above each MCB 26a and above word line pad 21b. Next, a BARC open etch is used to transfer the trench openings 30c-30e in the photoresist layer through the BARC layer and stop on the BL ILD layer 29. Thereafter, a second plasma etch process is employed to transfer the openings through the BL ILD layer 29. Note that dielectric layer 28 serves as an etch stop during the BL ILD 29 oxide etch step. Typically, an oxide etch comprises strong physical bombardment involving high power that could damage a MCB 26a if the metal contact is directly exposed to the plasma used for oxide etching. In one aspect, a dielectric layer 28 comprised of silicon nitride will serve as an etch stop layer to block the oxide plasma etch before reaching the MCBs 26a (and MTJ ILD 25 in word line pad area 50). A certain amount of overetching is applied to make sure that all bit line trenches 30c-30e reach the dielectric layer 28. At this point, the photoresist layer on the surface of BL ILD 29 and BARC inside vias 30a, 30b is completely removed by either in-situ dry plasma stripping using an Enabler etch chamber from Applied Materials, for example, or by ex-situ stripping in another dry plasma chamber.

A third etch process is used to transfer trench opening 30c and trench opening 30d in MRAM cells 40a, 40b, respectively, through dielectric layer 28 so that a portion of the top surfaces of MCBs 26a are exposed. Through a controlled nitride plasma etch, the via openings 30a, 30b are extended through dielectric layer 22 and expose a portion of word line pad 21b at the same time as MCBs 26a are uncovered. A nitride plasma etch typically employs a lower power with less physical bombardment than an oxide etch. A wet cleaning is applied following an overetch beyond end point during the third (nitride) etch to remove any residues as appreciated by those skilled in the art. In a preferred embodiment, the width v of bit line trenches 30c, 30d is less than the width w (FIG. 5) of MCBs 26a.

Figure 11:
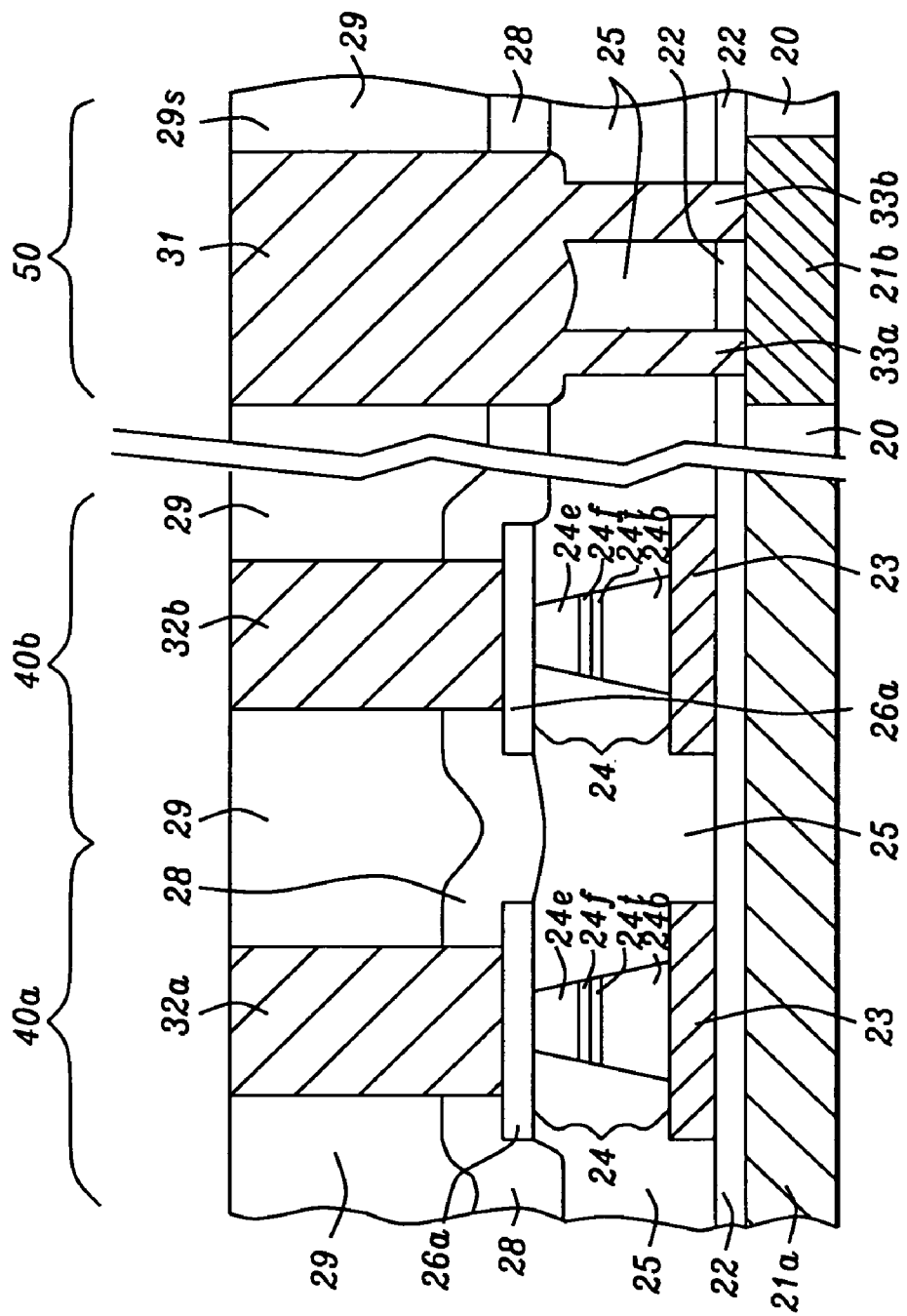
FIG. 11 is a cross-sectional view of the first embodiment after the MRAM structure in FIG. 10 is further processed to complete a dual damascene sequence with a bit line contacting each MCB and a bit line pad connected to a word line pad through vias.

Referring to FIG. 11, a barrier layer and seed layer (not shown) are sequentially deposited by a PVD method, for example, on the top surface of BL ILD layer 29 and on the sidewalls and bottoms of trenches 30c-30e and vias 30a, 30b. In a following step, an electroplating process is employed to deposit a metal such as Cu to fill the trenches 30c-30e and vias 30a, 30b. After a CMP process is applied to remove unwanted metal, a top surface 29s of BL ILD layer 29 becomes coplanar with bit line 32a in MRAM cell 40a, with bit line 32b in MRAM cell 40b, and with bit line pad 31 in word line pad area 50 to complete the dual damascene process. The electroplating process also forms via connections 33a, 33b between WL pad 21b and BL pad 31. It should also be understood that the dual damascene process described herein may be replaced by a well known single damascene method to construct a bit line metal layer. However, a single damascene method requires more steps than a dual damascene fabrication and is typically more costly to implement.

Returning to FIG. 5, if the MCB depth d is sufficiently large such that the resulting topography will lead to photoresist patterning problems in subsequent steps described in the first embodiment, then an alternative (second) embodiment depicted in FIG. 6 may be employed. As shown in FIG. 6, an oxide layer 34 such as silicon oxide is deposited on MTJ ILD layer 25 and MCBs 26a by a CVD method. Thereafter, an oxide CMP process is used to remove excess oxide such that oxide layer 34 is coplanar with MCBs 26a. Note that while the process of the second embodiment offers a flat surface (no step height d) comprised of oxide layer 34 and MCBs 26a upon which to build a dual damascene structure for bit line metal layer fabrication, there is an additional cost associated with the extra process steps. Furthermore, when MCBs 26a are comprised of Ta, for example, a 30 to 50 Angstrom thickness of Ta is removed during the oxide CMP process that involves a certain amount of over polishing to ensure that all MCBs have an exposed top surface.

Figure 12:
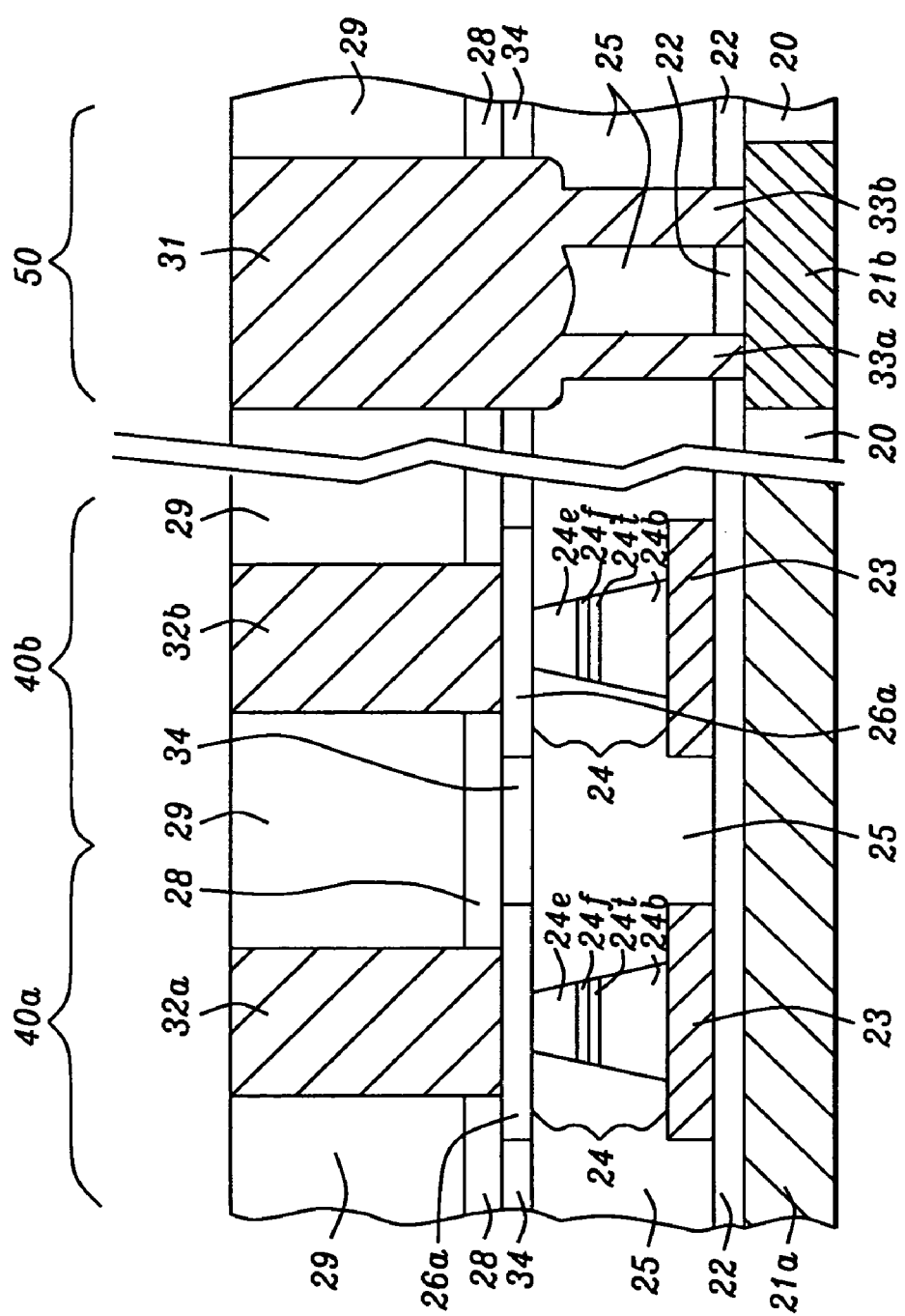
FIG. 12 is a cross-sectional view of a second embodiment of the present invention after a dual damascene sequence is performed on the intermediate MRAM structure in FIG. 6 to form a bit line over each MCB and a bit line pad over a word line pad.

Referring to FIG. 12, the second embodiment is shown at a point where the dual damascene process flow previously described in the first embodiment has been completed to form bit lines 32a, 32b, and BL pad 31 with via connections 33a, 33b to WL pad 21b.

According to a third embodiment illustrated in FIG. 7, a dielectric layer 27 which is preferably silicon nitride is deposited on MCB layer 26 (FIG. 4) prior to the patterning step that forms a plurality of metal contact bridges 26a. Then the sequence of BARC and photoresist coating, photoresist patterning, and pattern transfer through the BARC with an etch step as previously described is followed. In this embodiment, an additional etch step is required to transfer the openings in the photoresist layer and BARC through dielectric layer 27 and stop on MCB layer 26. Subsequently, a metal etch step transfers the openings through the MCB layer to form MCBs 26a. Following a wet clean process that typically removes a portion of the exposed top surface of MTJ ILD layer 25, a step height d2 is generated. The advantage of the third embodiment over the previous two embodiments is that a dielectric layer 27 protects the surface of MCBs 26a during metal etching, photoresist stripping and the wet cleaning steps. However, step height d2 is likely to be greater than d in the first embodiment since the dielectric layer 27 adds to the MCB depth d2. This disadvantage can be overcome somewhat when dielectric layer 27 is silicon nitride with a thickness >300 nm and thereby serves as an oxide etch stop during a later dual damascene etch step. In that case, a thick oxide (BL ILD 29) less than about 4000 Angstroms thick may be deposited directly on dielectric layer 27 without the need for a dielectric layer 28 used in the first two embodiments.

Figure 13:
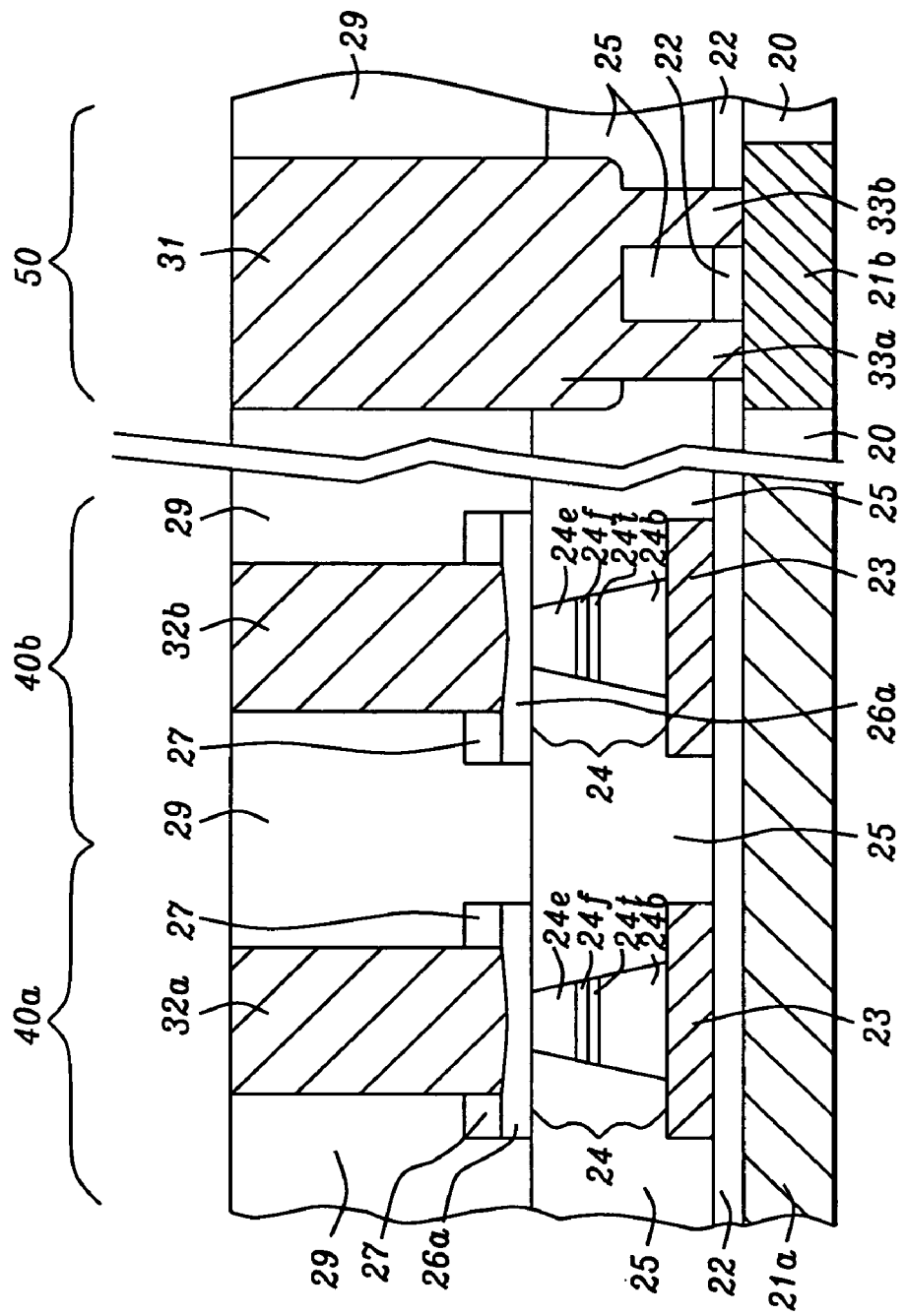
FIG. 13 is a cross-sectional view of a third embodiment of the present invention after a dual damascene sequence is performed on the intermediate MRAM structure in FIG. 7 to form a bit line over each MCB and a bit line pad over a word line pad.

Referring to FIG. 13, the third embodiment is shown at a point where the dual damascene process flow previously described in the first embodiment with the exception of substituting dielectric layer 27 for dielectric layer 28 has been completed to form bit lines 32a, 32b, and BL pad 31 with via connections 33a, 33b to WL pad 21b. Note that BL pad 31 may extend deeper into MTJ ILD layer 25 since there is no etch stop layer present in word line pad area 50 where thick oxide layer 29 directly contacts MTJ ILD layer 25.

Figure 8:
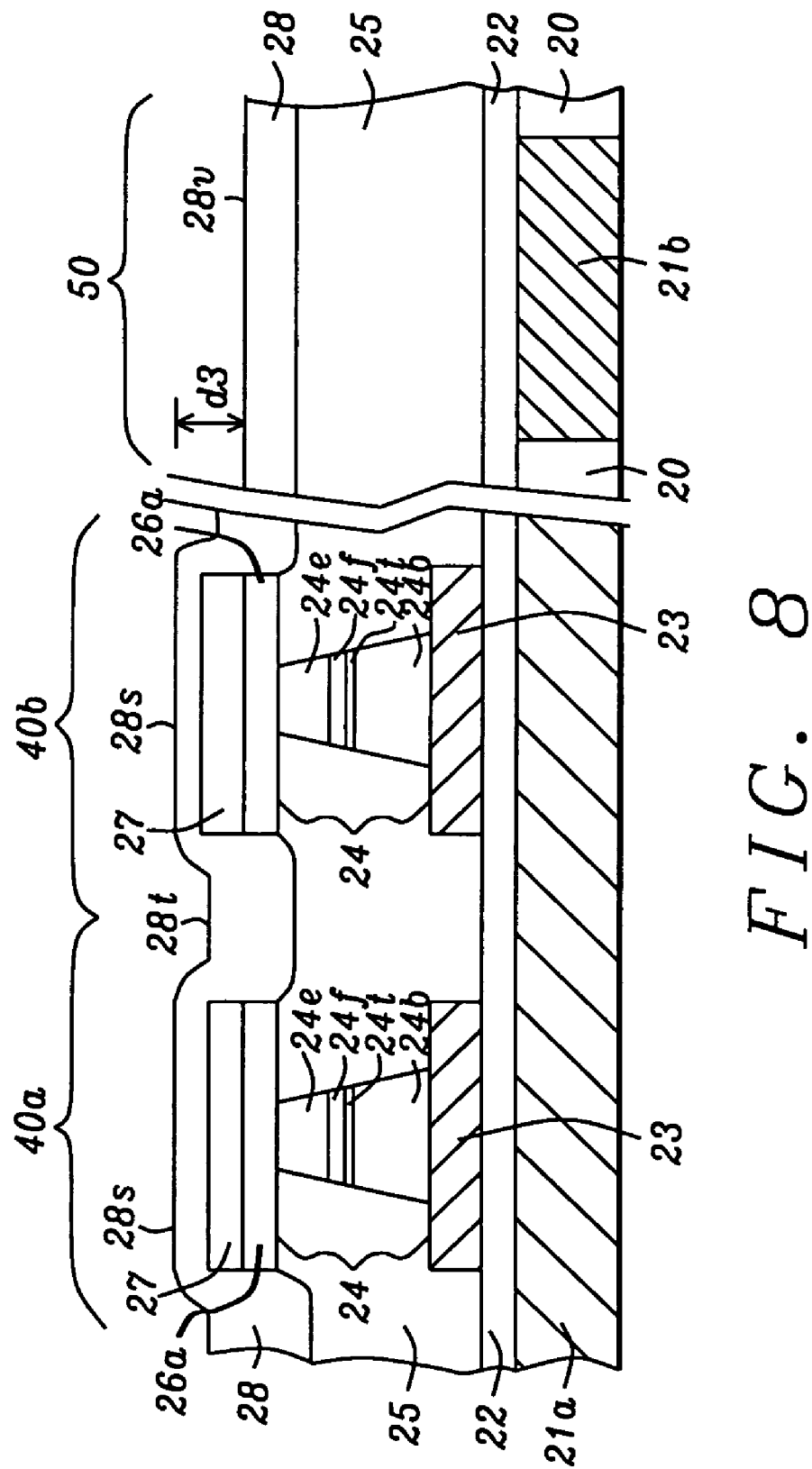
FIG. 8 is a cross-sectional view that represents a modification of the MRAM structure in FIG. 7 where a second nitride layer is formed on the first nitride layer after the MCB layer is patterned according to a fourth embodiment of the present invention.

A fourth embodiment of the present invention represents a modification of the third embodiment. Referring to FIG. 8, a dielectric layer 27, preferably silicon nitride, is formed on the MCB layer 26 prior to fabricating a plurality of MCBs 26a. In this case, a thin silicon nitride layer preferably less than 100 Angstroms thick is used to reduce the step height after MCB patterning to less than d2 (not shown). Since the dielectric layer 27 that serves as a protective cap on MCBs 26a is relatively thin and may not be sufficiently thick to be an effective oxide etch stop layer, a second dielectric layer 28 which is preferably silicon nitride is deposited on dielectric layer 27 after the MCBs 26a are formed and a post-etch wet cleaning step is performed. Therefore, the total nitride thickness above MCBs 26a reaches a range of 200 to 500 Angstroms which is acceptable as an oxide etch stop layer during the trench forming step of a dual damascene process sequence. The BL ILD layer 29 (FIG. 14) may have a thickness from 2000 to 9000 Angstroms in this embodiment. Although the MCB 26a depth may be as large as 250 Angstroms including a 100 Angstrom contribution from dielectric layer 27, and 150 Angstroms of MCB 26a that allows for a 50 Angstrom metal loss during over etching of bit line trenches, the step height should not cause subsequent photoresist patterning problems if the BL ILD layer 29 thickness is over 3000 Angstroms. In one aspect, the fourth embodiment may be preferred over the previous embodiments in that it protects MCBs 26a from etching damage and also avoids photoresist patterning issues by incorporating an oxide layer greater than 3000 Angstrom thick to overcome a substantial step height (MCB depth).

Referring to FIG. 14, the fourth embodiment is shown at a point where the dual damascene process flow previously described in the first embodiment has been completed to form bit lines 32a, 32b, and BL pad 31 with via connections 33a, 33b to WL pad 21b. Note that the dual damascene structure of the fourth embodiment differs from that of the first embodiment only by including an additional dielectric layer 27 between the top surface of MCBs 26a and dielectric layer 28.

All embodiments of the present invention offer several advantages over the prior art. First, a metal contact bridge (MCB) is formed directly on the top surface of a top electrode in a MTJ so there is no need to carefully control the amount of over etching during BL trench formation which eliminates the open circuit issue caused by insufficient etching of a BL ILD layer. Moreover, the MCB serves as an effective stop layer during BL trench overetching thereby preventing sub-trench formation adjacent to top electrodes that causes MTJ shorting. The elimination of sub-trenches is a significant improvement that also provides a plurality of uniformly thick MCBs which results in improved MRAM performance and reliability. The MCB also eliminates the intrusion of a top electrode and free layer into a bit line which results in a more uniform BL magnetic field than generated by a conventional MRAM structure in a write operation. The MCB in the present invention also enables a MRAM design with a thin top electrode to produce a stronger BL magnetic field on the free layer while maintaining a tight free layer to bit line distance. Finally, the production yield of MRAM devices using a fabrication method described herein will be higher than previously realized because of the elimination of defects caused by over etching or under etching of dielectric layers during the bit line trench etch.

While this invention has been particularly shown and described with reference to, the preferred embodiment thereof, it will be understood by those skilled in the art that various changes in form and details may be made without departing from the spirit and scope of this invention.

I claim:

1. A MRAM structure formed on a substrate, comprising:
   (a) a first conductive metal layer formed on the substrate and comprising a first conductive line and a first conductive metal pad;
   (b) a plurality of bottom electrodes aligned above said first conductive line and separated from the first conductive line by a first dielectric layer;
   (c) a plurality of magnetic tunnel junction (MTJ) elements wherein each MTJ has a bottom surface contacting a bottom electrode, and an uppermost top electrode with a top surface having a first width;
   (d) a plurality of metal contact bridges (MCBs) wherein each MCB has a bottom surface contacting a top surface of an underlying top electrode, and a top surface contacting a second conductive line, each of said MCBs has a second width greater than said first width; and
   (e) a second conductive metal layer comprising:
      (1) a plurality of second conductive lines wherein each second conductive line has a bottom surface facing said substrate and contacting an upper surface of a MCB;
      (2) a second conductive metal pad that is electrically connected to said first conductive metal pad; and
      (3) a plurality of vias that connect said second conductive metal pad with said first conductive metal pad.

2. The MRAM structure of claim 1 wherein the first conductive line is a word line, the first conductive metal pad is a word line pad, the plurality of second conductive lines are bit lines and the second conductive pad is a bit line pad.

3. The MRAM structure of claim 1 wherein each of said plurality of MCBs is comprised of a low resistivity, highly conductive metal, metal compound, or alloy.

4. The MRAM structure of claim 3 wherein said MCBs are comprised of Ta, TaN, Ti, TiN, or W.

5. The MRAM structure of claim 1 wherein each of said MCBs has a thickness from about 30 to 300 Angstroms.

6. The MRAM structure of claim 1 wherein each of said MCBs is a line that runs parallel to an overlying second conductive line, or is a sectioned line wherein a separate MCB is formed above each MTJ.

7. The MRAM structure of claim 1 wherein the plurality of second conductive lines has a width that is less than said second width.

8. A method of fabricating a MRAM structure, comprising:
   (a) providing a substrate comprised of a plurality of MTJ elements each having a top surface with a first width and that is essentially coplanar with a top surface of a MTJ inter-level dielectric (ILD) layer, each MTJ element has a bottom surface that contacts a bottom electrode in an array of bottom electrodes, said bottom electrode array is separated from an underlying first conductive metal layer by a first dielectric layer;

(b) forming a plurality of metal contact bridges (MCBs) on said substrate wherein each MCB has a bottom surface contacting a top surface of a MTJ element, a second width greater than said first width, and a top surface;

(c) depositing a second dielectric layer on the top surface of each of said plurality of MCBs and on said MTJ ILD layer in a first region wherein the first conductive metal layer is comprised of a first conductive line, and on said MTJ ILD layer in a second region wherein the first conductive layer is comprised of a first metal pad;

(d) depositing an oxide dielectric layer on said second dielectric layer;

(e) forming a plurality of trenches with sidewalls in the oxide dielectric layer and second dielectric layer in said first region wherein a trench is aligned above each MCB and exposes a top surface of a MCB, forming a plurality of vias with sidewalls in said MTJ ILD layer and in said first dielectric layer in said second region that exposes a top surface of said first metal pad, and forming a trench in said second dielectric layer and in said oxide dielectric layer in the second region wherein the trench in said second region has sidewalls and is aligned above said vias;

(f) filling said trenches in the first and second regions and the vias in the second region with a second conductive metal to form a plurality of second conductive lines wherein a second conductive line contacts a top surface of each MCB, and a second metal pad that is connected to said first metal pad through a plurality of vias; and (g) planarizing a top surface of each of the trenches in the first and second regions to be coplanar with a top surface of the oxide dielectric layer.

9. The method of claim 8 further comprised of forming a third dielectric layer on said MTJ ILD layer and between said plurality of MCBs before the second dielectric layer is deposited, said third dielectric layer has a top surface that is coplanar with the top surface of each of said plurality of MCBs.

10. The method of claim 8 wherein the first conductive line is a word line, the first metal pad is a word line pad, the plurality of second conductive lines are bit lines and the second metal pad is a bit line pad.

11. The method of claim 8 wherein steps (c)-(g) are performed by following a dual damascene process.

12. The method of claim 11 wherein the dual damascene process comprises sequentially forming a barrier layer and a seed layer on sidewalls of the trenches and vias and on exposed top surfaces of the MCBs and first metal pad before depositing the second conductive metal.

13. The method of claim 8 wherein each of said plurality of MCBs is comprised of a low resistivity, highly conductive metal, metal compound, or alloy.

14. The method of claim 8 wherein said MCBs are comprised of Ta, TaN, Ti, TiN, or W.

15. The method of claim 8 wherein each of said second conductive lines has a width less than said second width.

16. The method of claim 8 wherein each of said MCBs is a line that runs parallel to an overlying second conductive line, or is a sectioned line wherein a separate MCB is formed above each MTJ.

17. The method of claim 8 wherein each of said MCBs has a thickness from about 30 to 300 Angstroms.

18. A method of fabricating a MRAM structure, comprising:

(a) providing a substrate comprised of a plurality of MTJ elements each having a top surface with a first width and that is essentially coplanar with a top surface of a MTJ inter-level dielectric (ILD) layer, and each having a bottom surface that contacts a bottom electrode in an array of bottom electrodes, said bottom electrode array is separated from an underlying first conductive metal layer by a first dielectric layer;

(b) sequentially depositing a metal contact bridge layer and a silicon nitride layer on the substrate;

(c) forming a plurality of stacks on said substrate each comprising a lower metal contact bridge (MCB) having a bottom surface contacting a top surface of a MTJ element and a second width greater than said first width, and an upper silicon nitride layer with a top surface;

(d) depositing an oxide dielectric layer on the top surface of the upper silicon nitride layer in each of said plurality of stacks and on said MTJ ILD layer in a first region wherein the first conductive metal layer is comprised of a first conductive line, and on said MTJ ILD layer in a second region wherein the first conductive layer is comprised of a first metal pad;

(e) forming a plurality of trenches with sidewalls in said first region wherein a trench is aligned above each MCB and exposes a top surface of a MCB, forming a plurality of vias with sidewalls in said MTJ ILD layer and in said first dielectric layer in said second region that exposes a top surface of said first metal pad, and forming a trench in said oxide dielectric layer in the second region wherein the trench in said second region has sidewalls and is aligned above said vias;

(f) filling said trenches in the first and second regions and the vias in the second region with a second conductive metal to form a plurality of second conductive lines wherein a second conductive line contacts a top surface of each MCB, and a second metal pad that is connected to said first metal pad through a plurality of vias; and (g) planarizing a top surface of each of the trenches in the first and second regions to be coplanar with a top surface of the oxide dielectric layer.

19. The method of claim 18 further comprised of forming a second dielectric layer on the top surface of the silicon nitride layer in said plurality of stacks and on said MTJ ILD layer in the first and second regions before depositing the oxide dielectric layer.

20. The method of claim 18 wherein the first conductive line is a word line, the first metal pad is a word line pad, the plurality of second conductive lines are bit lines and the second metal pad is a bit line pad.

21. The method of claim 18 wherein steps (d)-(g) are performed by following a dual damascene process.

22. The method of claim 21 wherein the dual damascene process comprises sequentially forming a barrier layer and a seed layer on sidewalls of the trenches and vias and on exposed top surfaces of the MCBs and first metal pad before filling the trenches and vias with the second conductive metal.

23. The method of claim 18 wherein each of said plurality of MCBs is comprised of a low resistivity, highly conductive metal, metal compound, or alloy.

24. The method of claim 18 wherein said MCBs are comprised of Ta, TaN, Ti, TiN, or W.

25. The method of claim 18 wherein each of said MCBs has a thickness from about 30 to 300 Angstroms.

26. The method of claim 18 wherein each of said MCBs is a line that runs parallel to an overlying second conductive line, or is a sectioned line wherein a separate MCB is formed above each MTJ element.

27. The method of claim 18 wherein the plurality of second conductive lines has a width greater than said second width.

* * * * *